United States Patent [19]

Masik

[11] Patent Number: 5,336,353
[45] Date of Patent: Aug. 9, 1994

[54] PROCESS FOR THE PRODUCTION OF A MULTILAYER PRINTED CIRCUIT BOARD

[75] Inventor: Jiri Masik, Nantes, France

[73] Assignee: Polyclad Europe AB, Perstorp, Sweden

[21] Appl. No.: 946,429

[22] PCT Filed: Apr. 17, 1991

[86] PCT No.: PCT/SE91/00270

§ 371 Date: Jan. 11, 1993

§ 102(e) Date: Jan. 11, 1993

[87] PCT Pub. No.: WO91/18491

PCT Pub. Date: Nov. 28, 1991

[51] Int. Cl.$^5$ .............. B32B 31/00; B32B 31/28; H01L 21/306
[52] U.S. Cl. .............. 156/273.7; 156/634; 156/645; 156/656; 156/902; 156/273.9; 156/275.1; 156/290; 156/307.7
[58] Field of Search .......... 156/273.5, 273.7, 275.1, 156/272.2, 307.7, 379.6, 379.7, 379.8, 630, 273.9; 29/830, 833

[56] References Cited

U.S. PATENT DOCUMENTS 4,481,533 11/1984 Alzmann et al. .
4,702,785 10/1987 Burger .

FOREIGN PATENT DOCUMENTS 2917472 11/1980 Fed. Rep. of Germany .
3240754 5/1983 Fed. Rep. of Germany .
3423181 1/1986 Fed. Rep. of Germany .
62-233211 10/1987 Japan .
63-27244 2/1988 Japan .
63-56995 3/1988 Japan .
298195 10/1990 Japan .

OTHER PUBLICATIONS

G. Pohl et al *Producing and Jointly Processing Base Laminates for Multilayer Printed Circuit Cards,* "IBM Technical Disclosure Bulletin", vol. 27, No. 8, Jan. 1985, p. 4841.

Primary Examiner—Michael W. Ball
Assistant Examiner—Richard Crispino
Attorney, Agent, or Firm—Stevens, Davis, Miller & Mosher

[57] ABSTRACT

Process for the production of a multilayer printed circuit board composed of a plurality of so-called inner layers, each consisting of an insulating base of thin laminate of reinforcement material impregnated with thermosetting resin. The laminate is preferably provided with a layer of metal or metal alloy on both sides, in which layers a wiring pattern has been formed. Prepreg sheets of reinforcement material impregnated with thermosetting resin are placed between the inner layers. The resin is not fully cured. The inner layers are centered in respect of each other and fixed in this position by pressing the different sheets together along the long sides. Energy is then supplied within a limited area along the two long sides. Thereby the resin is heated and cured so that all sheets are bonded together with each other, preferably in a few spots or minor areas. The package obtained is then laminated under heat and pressure together with conventional outer layers and/or foils of metal or metal alloy to a multilayer printed circuit board which is then completed in the usual way.

6 Claims, No Drawings

PROCESS FOR THE PRODUCTION OF A MULTILAYER PRINTED CIRCUIT BOARD

The present invention relates to a process for the production of a multilayer printed circuit board composed of several so-called inner layers each consisting of an insulating base of thin laminate of reinforcement material impregnated with thermosetting resin, said laminate preferably having a layer of metal or metal alloy on both sides, in which layers a wiring pattern has been formed and so-called prepreg sheets of reinforcement material impregnated with thermosetting resin, whereby the resin is not fully cured, which prepreg sheets are placed between the inner layers.

Multilayer printed circuit boards are used for advanced electronic purposes and they are often composed of two or more inner layers of the kind mentioned above with intermediate prepreg sheets. In addition one outer layer consisting of a laminate of the above kind having a thin layer of metal or metal alloy on one side is placed on each side of the stack of inner layers. The metal layer is directed outwards. In certain cases the outer layers consist of a thin foil of metal or metal alloy instead of the disclosed laminate. Prepreg sheets are placed also between the outermost of the inner layers and the outer layers.

It is very important that the wiring pattern on the different inner layers are centered carefully in respect of each other and that they are not displaced at the subsequent pressing under heat and pressure which is used for bonding the different inner layers, outer layers and prepreg sheets together to a multilayer printed circuit board. After the lamination holes are namely drilled through the different layers. Then the holes must land in the intended place of the wiring pattern in the different layers. If the layers are displaced a bit in respect of each other so that the holes will land outside the wiring pattern in any layer, the necessary electric connection between the different wiring patterns will not be achieved when the walls of the holes are subsequently metallized. This results in a very costly cassation of the whole multilayer printed circuit board.

The outermost metal layers of the multilayer printed circuit board produced are provided with a wiring pattern. Then the different conventional components can be mounted on the printed circuit board.

Efforts have been in different ways to solve the above problem with the costly cassation. According to one known method the different inner layers, the prepreg sheets and the outer layers are provided with holes. These holes are drilled with a careful precision and in such a way that the different wiring patterns land in a correct position above each other when turned rivets are inserted through the holes. With this technique a precision of 125 $\mu$m can be obtained. Thus, the present demand of 25 $\mu$m needed at the production of multilayer printed circuit boards with close-packed signal circuits cannot be met. Therefore, often the cassation will reach 20% which is wholly unacceptable from the viewpoint of costs.

According to the present invention it has been possible to solve the above cassation problem and bring about a process for the production of a multilayer printed circuit board composed of a plurality of so-called inner layers, each consisting of an insulating base of thin laminate of reinforcement material impregnated with thermosetting resin said laminate preferably being provided with a layer of metal or metal alloy on both sides. In these layers a wiring pattern has been formed. So-called prepreg sheets of reinforcement material impregnated with thermosetting material are placed between the inner layers. The resin in the prepregs is not fully cured.

The process comprises centering the inner layers in respect of each other and fixing them in position by pressing the different layers together along the two long sides. Energy is then supplied within a limited area along the two long sides, whereby the resin is heated and cured so that all layers are bonded together with each other, preferably in a few spots or minor areas. Then the package obtained is laminated under heat and pressure with prepreg sheets and conventional outer layers and/or foils of metal or metal alloy to a multilayer printed circuit board which is then completed in the usual way.

Preferably the layer of metal or metal alloy consists of copper or copper alloy.

Normally, no high pressure is needed when the different inner layers with intermediate prepreg sheets are pressed together for then being bonded together in certain spots. It is enough if all layers have a good contact with each other so that the resin in the different layers at the heating will bind the sheets together in certain spots.

Often it is preferably to get a final curing of the resin in said spots. Then the sheets will not be able to move at the subsequent laminating step which takes place at a high pressure and a high temperature. However, in certain cases it can be enough if the resin is only caused to cure to a certain degree from the final curing point.

At a preferred embodiment of the invention microwaves are used for supplying the energy needed for binding the different layers together in certain spots. However, it is also possible to use for instance ultrasonics, hot air, infra-red radiation or the like instead.

Normally the reinforcement material consists of glass cloth, glass mat, paper or carbon fiber cloth. However, also other materials can be used.

Epoxy resin, bismaleamine triazine epoxy resin, phenol-formaldehyde resin, polyimide resin and polyester resin constitute examples on suitable thermosetting resins which can be used according to the invention.

Preferably the reinforcement material in the inner layers as well as in the prepreg sheets consists of glass cloth impregnated with epoxy resin. As mentioned above the resin in the prepreg sheets is not cured completely but usually to the so-called B-stage.

Suitably the inner layers are provided with sight marks. By means of these sight marks and cameras the inner layers can be centered in respect of each other. However, also other methods for centering the inner layers can be used.

The invention will be further explained in connection with the embodiment example below.

EXAMPLE

An inner layer consisting of a laminate of two sheets of glass cloth impregnated with epoxy resin and a wiring pattern of copper on both sides was placed on a vacuum table and sucked firmly thereto. Two prepreg sheets of glass cloth impregnated with epoxy resin were placed on top of the first inner layer.

Another inner layer with the same composition as the first one was placed on top of the prepreg sheets. The two inner layers were provided with sight marks. By means of these sight marks and two CCD-cameras the two inner layers were centered in respect of each other.

The package of inner layers and prepreg sheets was now pressed together in three spots along each side and then heated in these spots by means of microwave energy for about 12 seconds. Then the resin melted in these spots and cured so that the different sheets were bonded together with the wiring patterns on the two inner layers correctly centered in respect of each other.

Two prepreg sheets were placed on each side of the package obtained. On top of prepreg sheets a laminate consisting of two sheets of glass cloth impregnated with epoxy resin and a copper foil with a thickness of 18μm was placed. The copper foil was directed outwards from the package and it had no wiring pattern.

The whole package was placed in a press and pressed at a pressure of 40 kp/cm$^2$ and a temperature of 185° C. for 50 minutes.

In the multilayer printed circuit board connecting holes for the inner layers were drilled. The holes were metallized whereupon a wiring pattern was etched in the outer layers of copper foil. The connection between the inner layers passed the standards. The multilayer printed circuit board could then be completed in the usual way.

The invention is not limited to the embodiments shown, since these can be modified in different ways within the scope of the invention.

I claim:

1. Process for the production of a multilayer printed circuit board composed of a plurality of inner layers, each one consisting of an insulating base of thin laminate of reinforcement material impregnated with thermosetting resin, said laminate being provided with a layer of metal or metal alloy on both sides, in which layers a wiring pattern has been formed and prepreg sheets of reinforcement material impregnated with thermosetting resin, whereby the resin is not fully cured, which prepreg sheets are placed between the inner layers, which process comprises centering the position of the inner layers, which are provided with sightmarks, in respect to each other with cameras and fixing them in this position by pressing the prepreg sheets and the inner layers together along two long sides thereof, whereupon energy by means of microwaves is supplied within limited areas along the two long sides, whereby the resin of the prepregs is heated and cured so that all layers are bonded together with each other, in these limited areas, whereupon a package obtained thereby is laminated under heat and pressure together with prepreg sheets and outer layers consisting of an insulating base of thin laminate of reinforcement material impregnated with thermosetting resins, said laminate being provided with a layer of metal or metal alloy on the outer side only and/or foils of metal or metal alloy to a multilayer printed circuit board.

2. Process according to claim 1, wherein the reinforcement material consists of glass cloth, glass mat, paper or carbon fiber cloth.

3. Process according to claim 2, wherein the thermosetting resin used consists of epoxy resin, phenol-formaldehyde resin, polyimide resin, polyester resin or bismaleamine triazine epoxy resin.

4. Process according to claim 1 wherein the thermosetting resin used consists of epoxy resin, phenol-formaldehyde resin, polyimide resin, polyester resin or bismaleamine triazine epoxy resin.

5. Process according to claim 1 wherein the reinforcement material in the inner layers as well as in the prepreg sheets consists of glass cloth impregnated with epoxy resin.

6. Process according to claim 1, including drilling connecting holes in the inner and outer layers of the multi-layer printed circuit board, metallizing the drilled connecting holes and etching a wiring pattern in the outermost foils or layers of metal or metal alloy.

* * * * *